(12) United States Patent
Lamorey et al.

(10) Patent No.: US 9,190,399 B2
(45) Date of Patent: Nov. 17, 2015

(54) THERMALLY ENHANCED THREE-DIMENSIONAL INTEGRATED CIRCUIT PACKAGE

(71) Applicant: International Business Machines Corporation, Armonk, NY (US)

(72) Inventors: Mark C. Lamorey, Williston, VT (US); Janak G. Patel, South Burlington, VT (US); Peter Slota, Jr., Vestal, NY (US); David B. Stone, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/198,692

(22) Filed: Mar. 6, 2014

(65) Prior Publication Data

US 2015/0255441 A1 Sep. 10, 2015

(51) Int. Cl.
| | |
|---|---|
| *H01L 23/13* | (2006.01) |
| *H01L 21/00* | (2006.01) |
| *H01L 25/18* | (2006.01) |
| *H01L 23/367* | (2006.01) |
| *H01L 23/053* | (2006.01) |
| *H01L 25/00* | (2006.01) |
| *H01L 23/00* | (2006.01) |

(52) U.S. Cl.
CPC .............. *H01L 25/18* (2013.01); *H01L 23/053* (2013.01); *H01L 23/3675* (2013.01); *H01L 23/562* (2013.01); *H01L 25/50* (2013.01)

(58) Field of Classification Search
CPC ........... H01L 2924/01979; H01L 2924/15422; H01L 25/18; H01L 23/053; H01L 23/562; H01L 23/3675

USPC ........................... 257/704, 706; 438/122, 125
See application file for complete search history.

(56) References Cited

U.S. PATENT DOCUMENTS

| | | | |
|---|---|---|---|
| 5,920,458 A | 7/1999 | Azar | |
| 5,930,601 A | 7/1999 | Cannizzaro et al. | |
| 6,580,611 B1 | 6/2003 | Vandentop et al. | |
| 7,619,308 B1 | 11/2009 | Gektin et al. | |
| 7,724,528 B2 | 5/2010 | Mahoney et al. | |
| 7,903,425 B2 | 3/2011 | Hebel et al. | |
| 7,911,798 B2 | 3/2011 | Chang et al. | |
| 7,964,951 B2 | 6/2011 | Refai-Ahmed | |
| 8,264,851 B2 | 9/2012 | Jafari et al. | |
| 8,514,576 B1 * | 8/2013 | Osgood .......................... | 361/719 |
| 2008/0303138 A1 * | 12/2008 | Flett .............................. | 257/714 |
| 2010/0213600 A1 | 8/2010 | Lau et al. | |
| 2011/0304045 A1 | 12/2011 | Liu et al. | |
| 2011/0310565 A1 | 12/2011 | He | |
| 2012/0187578 A1 * | 7/2012 | Li .................................. | 257/778 |

FOREIGN PATENT DOCUMENTS

| | | |
|---|---|---|
| EP | 2450950 A2 | 5/2012 |
| EP | 2450950 A3 | 9/2012 |

* cited by examiner

*Primary Examiner* — Long K Tran
(74) *Attorney, Agent, or Firm* — Gibb & Riley, LLC; Anthony Canale

(57) ABSTRACT

Embodiments of the present invention disclose a semiconductor structure and method for increasing thermal dissipation in a three-dimensional integrated circuit package. In certain embodiments, the semiconductor structure comprises a logic die or a processor die attached to a substrate; a memory die stack attached to the logic die or the processor die; and a first lid attached to a first side of the logic or the processor die. The semiconductor structure further comprises a second lid attached to a second side of the memory die stack; a first heat sink attached to the first lid; and a second heat sink attached to the second lid.

20 Claims, 6 Drawing Sheets

THERMALLY ENHANCED THREE-DIMENSIONAL INTEGRATED CIRCUIT PACKAGE

FIELD OF THE INVENTION

The present invention relates generally to the field of semiconductor packaging and specifically to a structure and method for increasing thermal dissipation in a three-dimensional integrated circuit package.

BACKGROUND OF THE INVENTION

Thermal management of electronics can become an issue as the functions, speed, and features thereof increase. These increases typically enhance power requirements of devices, which can be addressed by allocating additional sinking space and/or increasing air flow. However, such solutions may prove to contradict such goals as miniaturization of electronics.

3-D integrated circuits ("3DIC") were invented to address the scaling challenge by stacking 2-D dies and connecting them in the third-dimension. In a 3DIC package, multiple dies are stacked, for example, on logic die or processor die, to improve performance, bandwidth, and/or functionality. However, since all dies are thermally coupled together, the heat from the last die at the bottom of the stack flows in to the upper die. Thus, when multiple dies are stacked together it becomes challenging to manage thermal energy in the 3DIC package as the primary heat dissipation path is in one direction only.

Although secondary heat dissipation paths exist, they can have relatively large thermal resistance properties that cause the heat flow into the path to dissipate a small percentage of the thermal energy. Unfortunately, the foregoing can either limit the power dissipation in a stack of dies in a 3DIC package or increase the junction temperature limit of dies to increase the power dissipation in the 3DIC package, both of which can impact performance, functionality, or bandwidth in the 3DIC package.

SUMMARY

Embodiments of the present invention disclose a semiconductor structure and method for increasing thermal dissipation in a three-dimensional integrated circuit package. In certain embodiments, the semiconductor structure comprises a logic die or a processor die attached to a substrate; a memory die stack attached to the logic die or the processor die; and a first lid attached to a first side of the logic die or the processor die. The semiconductor structure further comprises a second lid attached to a second side of the memory die stack; a first heat sink attached to the first lid; and a second heat sink attached to the second lid. In other embodiments, the method comprises attaching a logic die or a processor die to a substrate; a memory die stack to the logic die or the processor die; and a first lid to a first side of the logic or the processor die. The method further comprises attaching a second lid to a second side of the memory die stack; a first heat sink to the first lid; and a second heat sink to the second lid.

DETAILED DESCRIPTION

Figure 1:
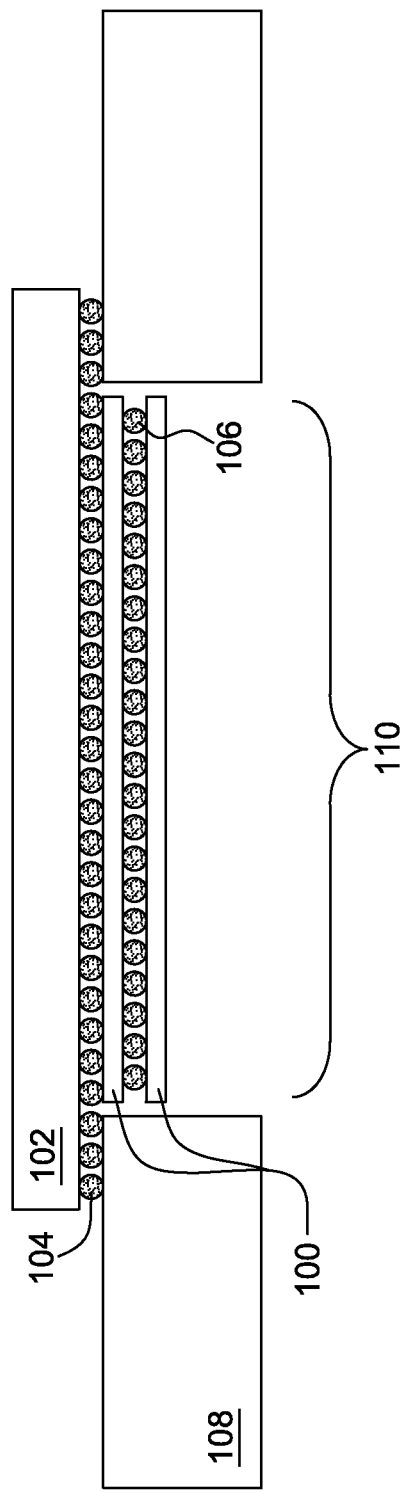
FIG. 1 illustrates a cross-sectional view of principal parts in the fabrication process of a semiconductor package, in accordance with an embodiment of the present invention.

Detailed embodiments of the claimed structures and methods are disclosed herein. The method steps described below do not form a complete process flow for manufacturing integrated circuits. The present embodiments can be practiced in conjunction with the integrated circuit fabrication techniques currently used in the art, and only so much of the commonly practiced process steps are included as are necessary for an understanding of the described embodiments. The Figures represent cross-section portions of a semiconductor chip or a substrate during fabrication and are not drawn to scale, but instead are drawn to illustrate the features of the described embodiments. Specific structural and functional details disclosed herein are not to be interpreted as limiting but merely as a representative basis for teaching one skilled in the art to variously employ the methods and structures of the present disclosure.

For purposes of the description hereinafter, the terms "upper", "lower", "right", "left", "vertical", "horizontal", "top", "bottom", and derivatives thereof shall relate to the disclosed structures and methods, as oriented in the drawing Figures. The terms "overlying", "atop", "over", "on", "positioned on", or "positioned atop" mean that a first element is present on a second element wherein intervening elements, such as an interface structure, may be present between the first element and the second element. The term "direct contact" means that a first element and a second element are connected without any intermediary conducting, insulating, or semiconductor layers at the interface of the two elements.

Embodiments of the three-dimensional integrated circuit ("3DIC") package described herein allow for heat dissipation in two directions, which can facilitate in an increase in power dissipation and/or a lowering of the specification of junction temperature limit therein to achieve the desired performance and/or functionality. A semiconductor package and fabrication method thereof according to an embodiment of the present invention are described below with respect to the schematic illustrations of FIGS. 1-5. Similar reference numerals denote similar features.

FIG. 1 depicts a cross-sectional view of principal parts in the fabrication process of a semiconductor package, in accordance with an embodiment of the present invention. Memory dies 100, which are pre-formed according to predetermined specifications, are attached together by controlled collapse chip connection ("C4") balls 106 using an appropriate process, such as hot air reflow. Memory dies 100 can include additional dies beyond those depicted. Memory dies 100 can be in electrical communication with each other. In an embodiment, memory dies 100 are not uniform in length and/or width.

C4 balls 106 include a fusible alloy material, such as a tin/silver alloy ("SnAg") and tin/silver/copper alloy. In an embodiment, memory dies 100 are random-access memory ("RAM") or dynamic random-access memory ("DRAM") memory dies. Memory dies 100 are attached to the center of the C4 side of chip 102 by C4 balls 104 using an appropriate process, such as reflow, to form a unit. C4 balls 104 and 106 can include similar material. In an embodiment, memory dies 100 do not extend beyond the periphery of chip 102. Chip 102 can be a logic or processor chip. The formed unit is then attached to substrate 108 on the C4 side of chip 102 by additional C4 balls 104 using an appropriate process in such a manner such that memory dies 100 partially extend into opening 110. Substrate 108 can include a silicon, laminate, ceramic, and/or composite material.

Figure 2:
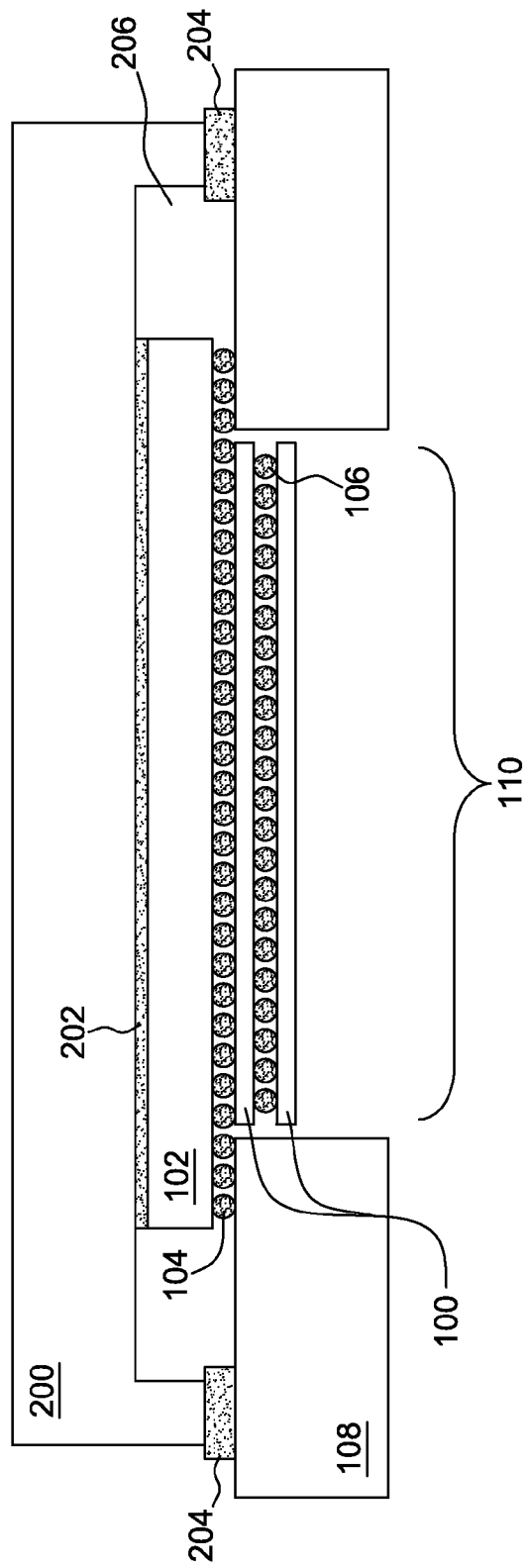
FIG. 2 illustrates a cross-sectional view of principal parts in the fabrication process of the semiconductor package of FIG. 1, in accordance with an embodiment of the present invention.

FIG. 2 illustrates a cross-sectional view of principal parts in the fabrication process of the semiconductor package of FIG. 1, in accordance with an embodiment of the present invention. Lid 200 is clamped or attached to chip 102 by thermal interface material ("TIM") 202.

Lid 200 can include a thermal conductive material, such as aluminum or nickel-plated copper. In an embodiment, TIM 202 can be any applicable thermal interface material, such as Cho-Therm T/A 274®. Lid 200 is also attached to the periphery of substrate 108 by adhesive 204. In an embodiment, lid 200 is attached to the periphery of substrate 108 in such a manner as to create a hermetic seal between the two structures. Adhesive 204 can be an electrically-insulating lid-seal adhesive, such as EA6700. Lid 200 can be attached to substrate 108 in such a manner as to provide mechanical support to the overall package. Underfill 206 can be filled with an insulating material or left unfilled.

Figure 3A:
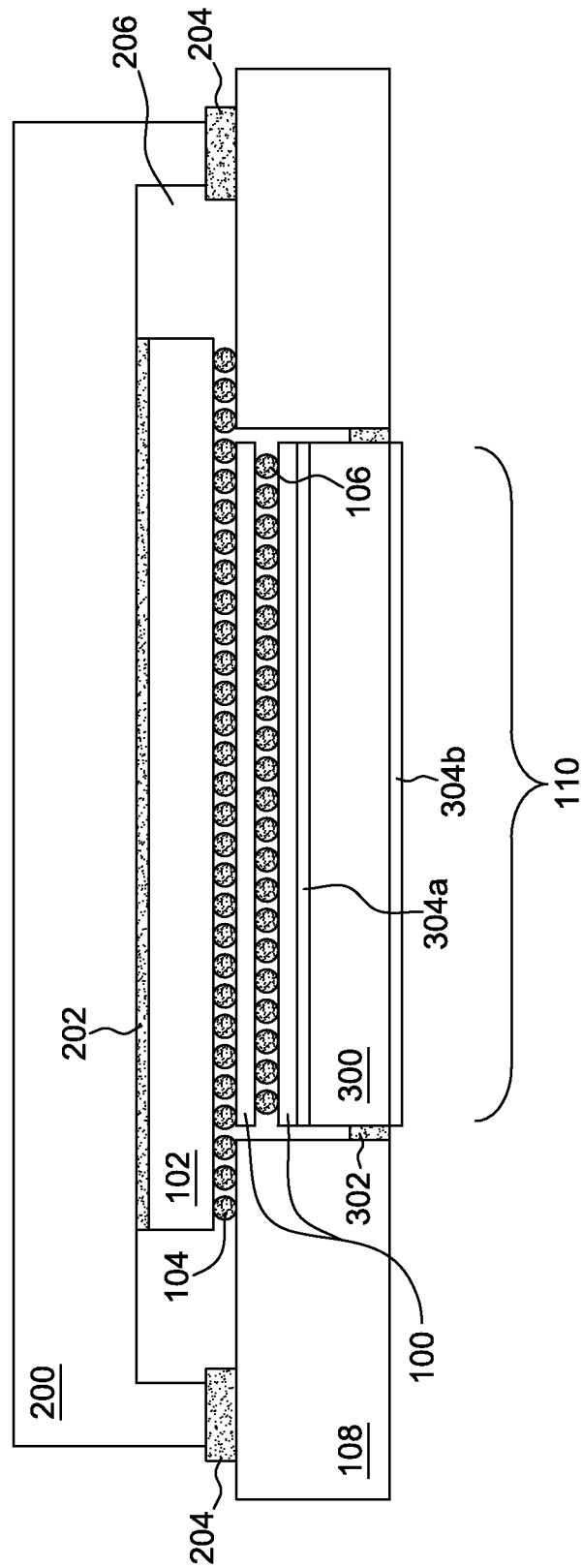
FIG. 3A illustrates a cross-sectional view of principal parts in the fabrication process of the semiconductor package of FIG. 2, in accordance with an embodiment of the present invention.

FIG. 3A illustrates a cross-sectional view of principal parts in the fabrication process of the semiconductor package of FIG. 2, in accordance with an embodiment of the present invention. Lid 300 is clamped or attached to an exposed die of memory die 100 the bottom side of opening 110 by TIM 304*a* using an appropriate process. Lids 200 and 300 can include similar material. In an embodiment, TIM 304*a* includes a phase change material. Lid 300 is also laterally connected to the substrate 108 by adhesive 302, which may include material similar to adhesive 204. Although not shown, lid 300 can be further attached to a heat sink by TIM 304*b*, which can include material similar to TIM 304*a*. To increase board-level reliability and/or mechanical strength of the unit, underfill 206 can be filled with a material, for example, epoxy, using an appropriate process, such as underfilling.

Figure 3B:
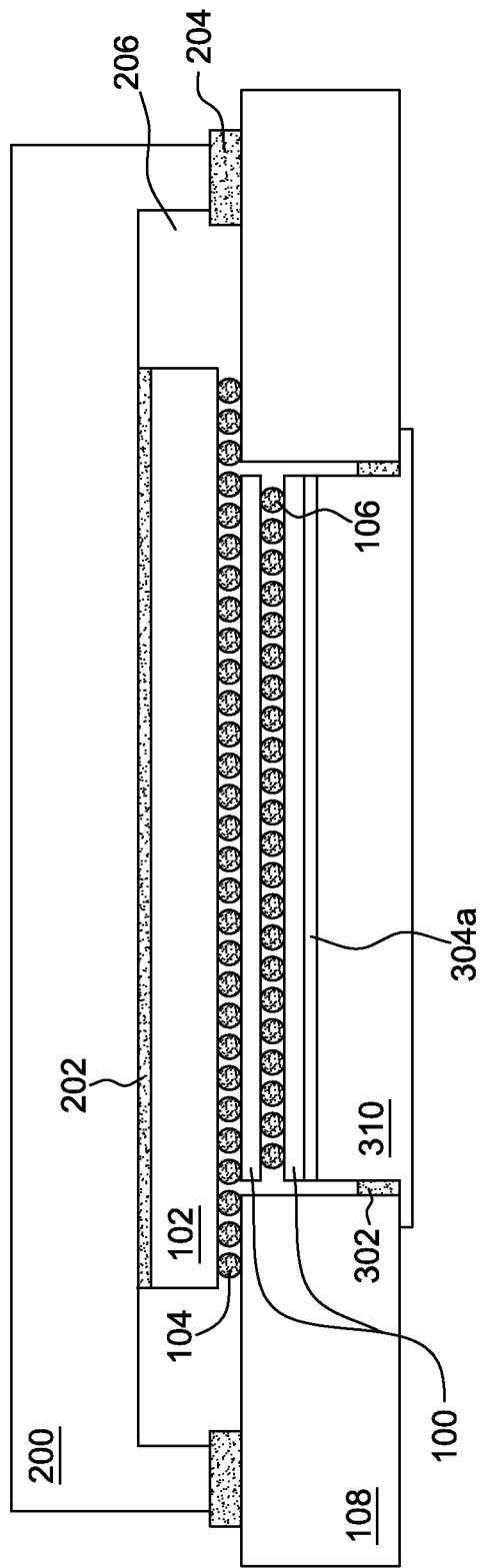
FIG. 3B illustrates a cross-sectional view of principal parts in the fabrication process of the semiconductor package of FIG. 2, in accordance with an embodiment of the present invention.
Figure 4:
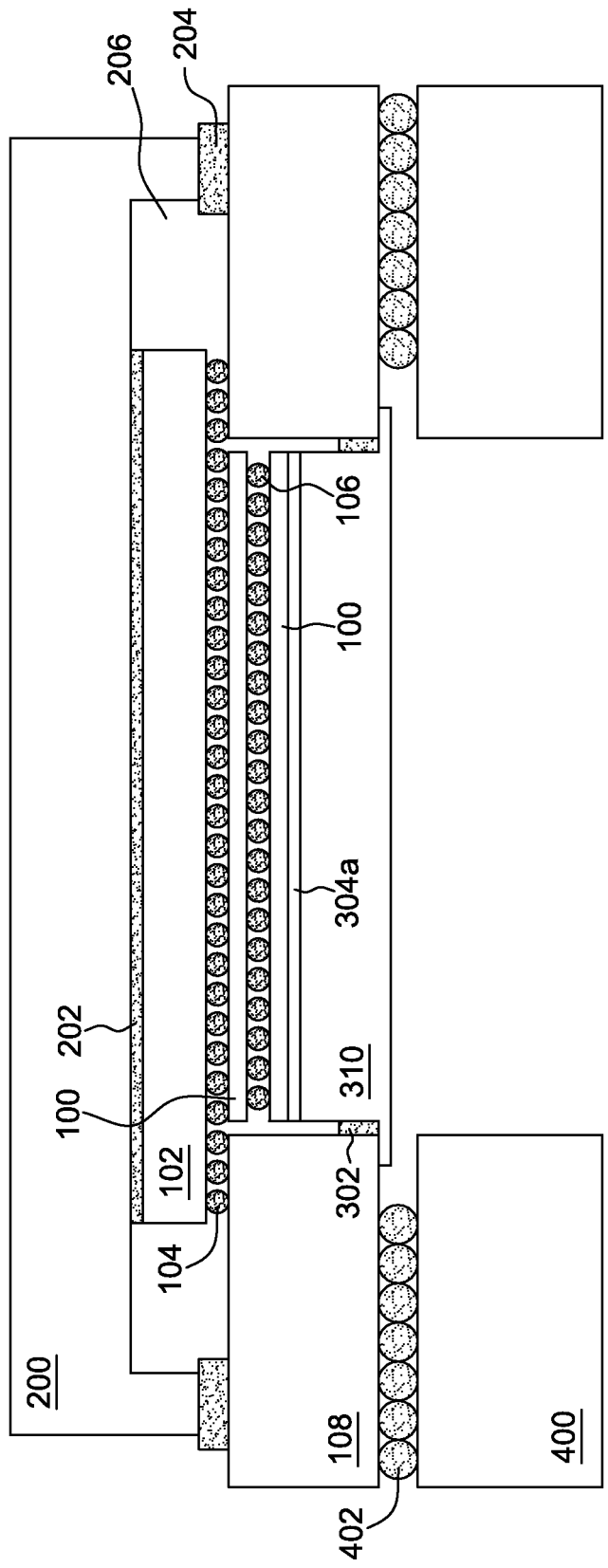
FIG. 4 illustrates a cross-sectional view of principal parts in the fabrication process of the semiconductor package of FIG. 3B, in accordance with an embodiment of the present invention.
Figure 5:
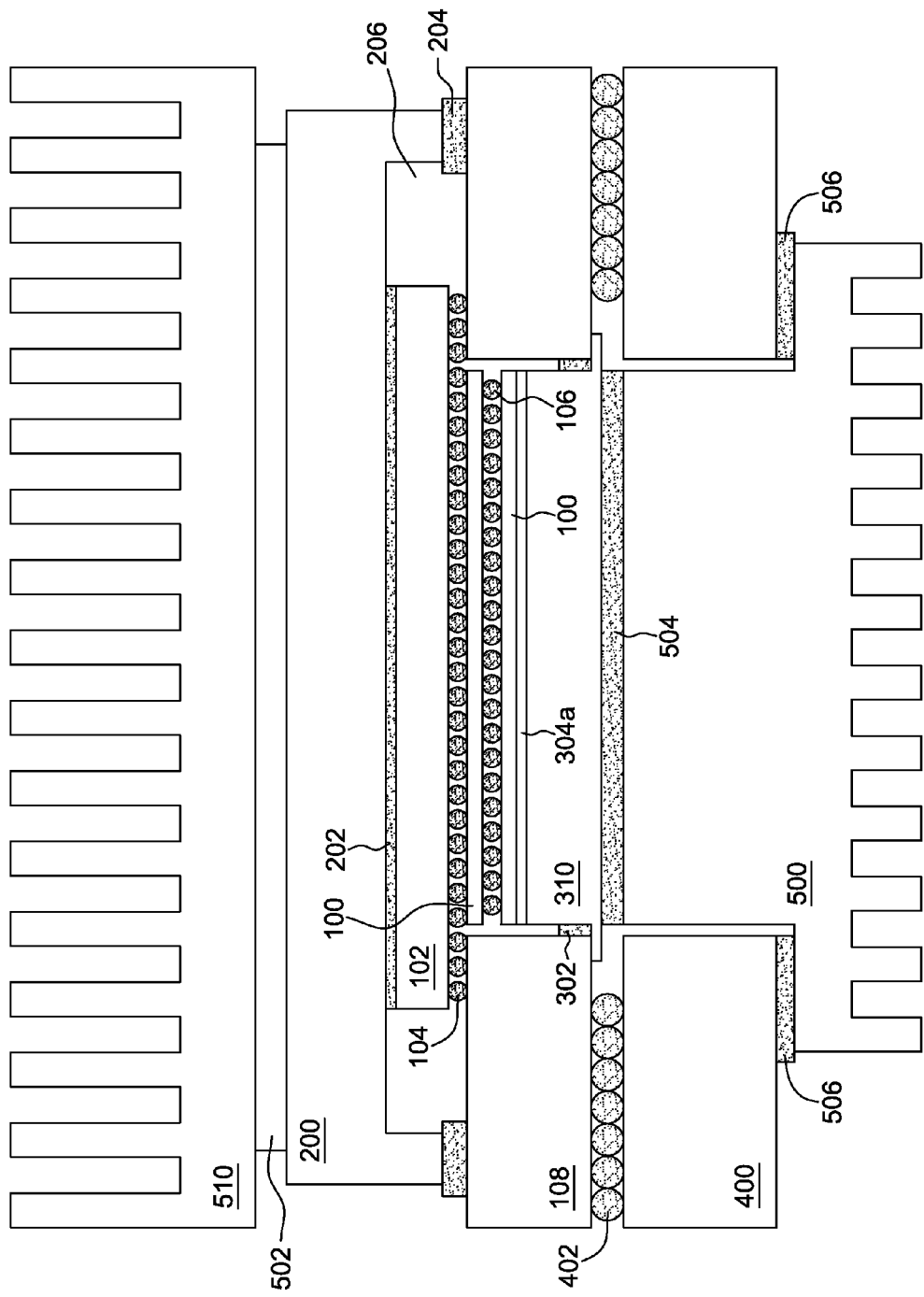
FIG. 5 illustrates a cross-sectional view of principal parts in the fabrication process of the semiconductor package of FIG. 4, in accordance with an embodiment of the present invention.

Alternatively, the bottom lid may extend under substrate 108, such as lid 310 depicted in FIG. 3B. FIG. 4 illustrates a cross-sectional view of principal parts in the fabrication process of the semiconductor package of FIG. 3B, in accordance with an embodiment of the present invention. The semiconductor package of FIG. 3B is attached to printed circuit board ("PCB") 400 by solder balls 402 using an appropriate process. FIG. 5 illustrates a cross-sectional view of principal parts in the fabrication process of the semiconductor package of FIG. 4, in accordance with an embodiment of the present invention. Heat sink 510 is attached to lid 200 by TIM 502. TIMs 502 and 304*a* can include similar material. Heat sink 500 is attached to lid 310 through the opening in PCB 400 by TIM 504. Heat sink 500 is designed in such a way to have a pedestal fashioned to tightly couple to the exposed die of memory dies 100. Heat sink 500 is attached to lid 310 by TIM 504 and to PCB 400 by TIM 506. TIMs 502, 504, 506, and 304*a* may include similar material.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
   a substrate having a first surface and a second surface opposite said first surface, said substrate further having an opening that extends vertically from said first surface to said second surface;
   a printed circuit board attached to said second surface;
   a first die aligned over said opening at said first surface;
   at least one second die within said opening at said first surface, said first die having a center portion attached to said at least one second die and a periphery attached to said first surface of said substrate adjacent to said opening;
   a first lid having a horizontal portion covering and attached to said first die and a vertical portion positioned laterally around said first die and attached to said first surface of said substrate;
   a second lid within said opening at said second surface and attached to said at least one second die opposite said first die;
   a first heat sink attached to said first lid; and
   a second heat sink attached to said second lid.

2. The semiconductor structure of claim 1, said first die comprising any one of a logic die and a processor die.

3. The semiconductor structure of claim 1, said at least one second die comprising a memory die stack comprising a plurality of dynamic random-access memory structures or random-access memory structures.

4. The semiconductor structure of claim 1, said printed circuit board having a hole that extends vertically through said printed circuit board and that is aligned with said opening in said substrate.

5. The semiconductor structure of claim 4, said second heat sink having a pedestal attached to said second lid and extending through said hole and further having an additional portion adjacent to said pedestal, said additional portion being wider than said pedestal, outside said hole and attached to said printed circuit board.

6. The semiconductor structure of claim 1, said second lid being laterally attached to said substrate within said opening and not positioned laterally between said at least one second device and said substrate within said opening.

7. The semiconductor structure of claim 1, further comprising a material on said first surface of said substrate between said first die and said vertical portion of said first lid, said material providing mechanical strength to said semiconductor structure.

8. A method comprising:
   providing a substrate having a first surface and a second surface opposite said first surface, said substrate further having an opening that extends vertically from said first surface to said second surface;
   aligning a first die over said opening at said first surface;

attaching a center portion of said first die to at least one second die within said opening at said first surface and a periphery of said first die to said first surface of said substrate adjacent to said opening;

attaching said second surface of said substrate to a printed circuit board;

attaching a horizontal portion of a first lid to said first die and a vertical portion of said first lid to said first surface of said substrate, said horizontal portion covering said first die and said vertical portion being positioned laterally around said first die;

attaching a second lid to said at least one second die opposite said first die, said second lid being within said opening at said second surface;

attaching a first heat sink to said first lid; and attaching a second heat sink to said second lid.

9. The method of claim 8, said first die comprising any one of a logic die and a processor die.

10. The method of claim 8, said at least one second die comprising a memory die stack comprising a plurality of dynamic random-access memory structures or random-access memory structures.

11. The method of claim 8, said printed circuit board having a hole that extends vertically through said printed circuit board and that is aligned with said opening in said substrate.

12. The method of claim 11, said second heat sink having a pedestal attached to said second lid and extending through said hole and further having an additional portion adjacent to said pedestal, said additional portion being wider than said pedestal, outside said hole and attached to said printed circuit board.

13. The method of claim 8, said second lid being laterally attached to said substrate within said opening and not positioned laterally between said at least one second die and said substrate within said opening.

14. The method of claim 8, further comprising filling an area on said first surface of said substrate between said first die and said vertical portion of said first lid with a material, said material providing mechanical strength.

15. A semiconductor structure comprising:
a substrate having a first surface and a second surface opposite said first surface, said substrate further having an opening that extends vertically from said first surface to said second surface;
a printed circuit board attached to said second surface of said substrate;
a first die aligned over said opening at said first surface;
a stack of second dies within said opening at said first surface, said first die having a center portion attached to said stack and a periphery attached to said first surface of said substrate adjacent to said opening;
a first lid having a horizontal portion covering and attached to said first die and a vertical portion positioned laterally around said first die and attached to said first surface of said substrate;
a second lid within said opening at said second surface and attached to said stack;
a first heat sink attached to said first lid; and
a second heat sink attached to said second lid.

16. The semiconductor structure of claim 15, said first die comprising any one of a logic die and a processor die and said second dies comprising comprising dynamic random-access memory structures or random-access memory structures.

17. The semiconductor structure of claim 15, said printed circuit board having a hole that extends vertically through said printed circuit board and that is said hole is aligned with said opening in said substrate.

18. The semiconductor structure of claim 17, said second heat sink having a pedestal attached to said second lid and extending through said hole and further having an additional portion adjacent to said pedestal, said additional portion being wider than said pedestal, outside said hole and attached to said printed circuit board.

19. The semiconductor structure of claim 15, said second lid being laterally attached to said substrate within said opening and not positioned laterally between said stack and said substrate within said opening.

20. The semiconductor structure of claim 15, further comprising a material on said first surface of said substrate between said first die and said vertical portion of said first lid, said material providing mechanical strength to said semiconductor structure.

* * * * *